United States Patent [19]

Sirinyan et al.

[11] Patent Number: 4,659,592
[45] Date of Patent: Apr. 21, 1987

[54] PROCESS FOR THE PRODUCTION OF LAMINATED MATERIALS

[75] Inventors: Kirkor Sirinyan, Bergisch-Gladbach; Friedrich Jonas, Aachen; Rudolf Merten, Leverkusen, all of Fed. Rep. of Germany

[73] Assignee: Bayer Aktiengesellschaft, Leverkusen, Fed. Rep. of Germany

[21] Appl. No.: 750,579

[22] Filed: Jun. 28, 1985

Related U.S. Application Data

[63] Continuation of Ser. No. 543,575, Oct. 19, 1983, abandoned.

[30] Foreign Application Priority Data

Nov. 13, 1982 [DE]  Fed. Rep. of Germany ....... 3242162

[51] Int. Cl.$^4$ ............................................. C23C 18/30
[52] U.S. Cl. ..................... 427/304; 427/98; 427/305; 427/306; 427/383.1; 428/901
[58] Field of Search ................... 427/98, 96, 304–306, 427/383.1; 428/901

[56] References Cited

U.S. PATENT DOCUMENTS

| 2,917,439 | 12/1959 | Liu . |  |
|---|---|---|---|
| 3,532,518 | 10/1970 | D'Ottario . |  |
| 3,549,599 | 12/1970 | Merten . |  |
| 3,666,549 | 5/1972 | Rhodenizer . |  |
| 3,684,534 | 8/1972 | Emerson | 106/1.23 |
| 4,188,415 | 2/1980 | Takahashi | 427/98 |
| 4,285,991 | 8/1981 | Gedrat . |  |
| 4,327,126 | 4/1982 | Ogden | 427/97 |
| 4,389,771 | 6/1983 | Cassidy . |  |
| 4,396,679 | 8/1983 | Gaku . |  |
| 4,493,861 | 1/1985 | Sirinyan | 427/304 |

FOREIGN PATENT DOCUMENTS 0043485  1/1982  European Pat. Off. .
1109199  4/1968  United Kingdom .

Primary Examiner—John D. Smith
Attorney, Agent, or Firm—Sprung Horn Kramer & Woods

[57] ABSTRACT

Metallized laminated materials are obtained by coating a solder-resistant core material with a non-conductive polymer film, and subsequent activation and wet-chemical metallization of the polymer film, the activation being carried out, without oxidative pretreatment, on the polymer film before it has hardened completely, and the final hardening only being effected after the metallization. The materials thus metallized are suitable for the production of printed circuits.

6 Claims, No Drawings

PROCESS FOR THE PRODUCTION OF LAMINATED MATERIALS

This is a continuation of application Ser. No. 543,575, filed Oct. 19, 1983 now abandoned.

The invention relates to a process for the production of heat-resistant laminated materials consisting of a core, a non-conductive polymer film laminated onto this core and a solderable metal layer applied thereto.

It is generally known (compare, for example, German Offenlegungsschrift No. 3,123,946), that laminated materials of this type such as are used, for example, for the production of printed circuits can be produced by treating the core material with a lacquer or a semi-hardened resin solution, hardening the resulting polymer film completely by heating and then treating the film with an oxidising agent before the surface thus prepared—if appropriate after activation, for example by means of a palladium salt solution—is exposed to a bath without a current.

However, the metallised materials produced in this manner have a number of disadvantages.

Thus, for example, because of the rubber component in the polymer film used in the process products according to the patent publication cited above, these products do not have sufficient dimensional stability under continuous heat in higher temperature ranges (that is to say above 140° C.).

However, even if polymer materials which are dimensionally stable under heat are employed, the conventional processes lead to unsatisfactory results because of the use of powerful oxidising agents (for example chromic/sulphuric acid). In particular, cavities are formed on the polymer films by the action of these oxidants, which results in deterioration of the physical properties (for example surface electrical resistance and tracking resistance) of this material.

Moreover, irreversible poisoning of the activating and metallising baths is caused by the chromium ions introduced into these baths together with the chromic/sulphuric acid.

It has now been found, surprisingly, that the above disadvantages can be very substantially avoided if the hitherto customary oxidative pretreatment and the mechanical abrading of the substrate surfaces are dispensed with and the polymer film applied to the core material before this film has been hardened completely is subjected to final hardening only after the activation and metallisation.

A metal coating which adheres well to the film surface, has an adhesive strength of at least 25 N/25 mm (according to DIN 53494) and which in practice is not detached even when exposed to severe conditions, such as, for example, during soldering of electronic and/or electrical components in the production of printed circuits, is obtained by this technologically simple method.

The production of laminated materials from an organic or inorganic core layer and a polymer film based on prepolymers and/or end polymers which is laminated with the core layer is generally known.

All polymers which have dimensional stability under heat for a period of at least 20 minutes $\geq 140°$ C. and have a specific electrical surface resistance of at least $10^{10} \Omega.\text{cm}^{-1}$ are suitable for the production of these polymer films. These requirements are fulfilled by numerous insulating lacquers which are commercially available or known from the literature and are based on aromatic polyether-sulphones, aromatic polyethers, polyamides, polyimides, polyamidoimides, polyesterimides, polyesteramides, isocyanurate-containing polyesters, polybenzoxazinediones, aromatic polyphenylene-sulphides, polyparabanic acids, polyurethanes and polyhydantoins.

The preparation of the abovementioned compounds is generally known, and can be found, for example, in "Grundriss der Makromolekularen Chemie (Fundamentals of Macromolecular Chemistry), II, pages 5–45, E. Vollmert-Verlag, Karlsruhe (1979)".

Polymer films of polyparabanic acids or of polyesters containing imide, amide or isocyanurate groups are preferably employed for the production of the laminated materials according to the invention.

The preparation of polyparabanic acids can be found, for example, in German Offenlegungsschrift No. 2,703,872. Polyesters containing amide, imide or isocyanurate groups are commercially available polymers, and their preparation is described, for example, in High Polymers volume XIV, parts I–III N. G. Gaylord Interscience Publishers, New York (1964). Polymer films of polyamides, polyamidoimides, polyhydantoins, polyimides and polyurethanes are particularly preferred.

The polyamides and polyamidoimides are aliphatic, cycloaliphatic or aromatic in nature and are commercially available.

The polyimides to be used according to the invention can be prepared by known processes from the corresponding acid dianhydrides and polyamines or polyisocyanates (compare J. Appl. Poly. Sci. 8, 1039 (1964)).

The polyurethanes, which are polyadducts of monomeric or oligomeric polyols (for example aliphatic polyols, polyethers containing hydroxyl groups, polyesters, containing hydroxyl groups, of polyfunctional carboxylic acids and polyols, and heterocyclic polyols) and preferably aromatic polyisocyanates, are generally known. Their preparation can be found, for example, in "Polyurethanes Chemistry and Technology Vol. XVI, Part. II. J. H. Saunders, Interscience Publishers". The polyhydantoins can be prepared by known processes from polyglycine esters and polyisocyanates, as described, for example, in German Patent Specification No. 1,795,751 and German Auslegeschrift No. 1,908,678.

Polymers based on polyhydantoins containing an ethyl acetate grouping in the 5-position of the hydantoin ring are very particularly preferred. These polymers are prepared by known processes (compare German Offenlegungsschrift No. 1,720,624 = U.S. Pat. No. 3,549,599), by reacting aspartates, prepared from polyamines and 1,2alkylenedicarboxylates, with polyisocyanates and subsequently cyclising the product to give polyhydantoins of the formula shown in the above patent literature. A further variant of this process is described in German Offenlegungsschrift No. 2,539,730, in which 1,2-alkylenedicarboxylates are reacted with polyureas to give the corresponding polyhydantoins.

Polyhydantoins which have been prepared using 1,2-alkylenedicarboxylate derivatives with a monounsaturated or polyunsaturated alcohol component are particularly preferred.

The amount of these unsaturated 1,2-alkylenedicarboxylates used can be varied within wide limits, and should be 2 to 100 mole%, preferably 5–30 mole %, based on the total amount of ester employed.

The process according to the invention can of course also be carried out using physical and/or chemical mixtures of the abovementioned polymers with phenolic, formaldehyde, melamine and epoxide resins, as long as these are compatible with one another.

Polymers which contain double bonds in the end position, on the side groups and/or in the main chain are particularly preferably used, for better fixing of the activation nuclei for the chemical metallisation following the film formation.

If the polymer films used do not contain unsaturated bonds, it is advisable to use organometallic activators of elements of sub-groups 1 and 8 of the periodic table, the organic part of which has at least one further functional group in addition to the groups required for metal-binding.

Functional groups such as carboxylic acid groups, carboxylic acid halide groups, carboxylic acid anhydride groups, carboxylate groups, carboxamide and carboximide groups, aldehyde and ketone groups, ether groups, sulphonamide groups, sulphonic acid groups and sulphonate groups, sulphonic acid halide groups, sulphonic acid ester groups, halogen-containing heterocyclic radicals, such as chlorotriazinyl, -pyrazinyl, -pyrimidinyl or -quinoxalinyl groups, activated double bonds, such as in vinylsulphonic acid derivatives or acrylic acid derivatives, amino groups, hydroxyl groups, isocyanate groups, olefine groups and acetylene groups as well as mercapto groups and epoxide groups, and furthermore higher-chain alkyl or alkenyl radicals from $C_8$, in particular oleyl, linoleyl, stearyl or palmityl groups, are particularly suitable for chemical anchoring of the activator to the polymer surface.

If no anchoring by chemical reaction takes place, the adhesive strength can also be achieved by adsorption of the organometallic activators onto the polymer surface, in which case the adsorption can be caused by, for example, hydrogen bonding or van der Waals forces.

It is advantageous to match the functional groups causing adsorption to the particular polymer. Thus, activation of polymer films based on polyamide or polyester is particularly promoted by activators which have, for example, additional carbonyl or sulphonyl groups.

Functional groups such as carboxylic acid groups and carboxylic acid anhydride groups are particularly suitable for anchoring the activator to the polymer surface by adsorption.

The groups in the organic part of the organometallic compound which are required for metal-bonding are known per se. These are, for example, C—C or C—N double and triple bonds and groups which can form a chelate complex, for example OH, SH, CO, CS or COOH groups.

The organometallic compound can, for example, be dissolved or dispersed in the organic solvent, or a concentration of the organometallic compounds with the solvent can also be used.

If the organometallic compound contains ligands which permit chemical fixing to the substrate surface, activation from an aqueous phase may also be possible.

However, without restricting the scope of the invention, it is advisable to maintain the following conditions when the process is carried out on an industrial scale:

1. The organometallic compounds used should be stable in air and towards moisture. They should be readily soluble in organic solvents but have a low solubility in water. They should also be able to undergo reduction with conventional reducing agents to give a compound having a catalytic action in the metallisation without a current.

2. The solutions of the organometallic compounds in organic solvents should be stable in air and towards moisture.

3. It should be possible to remove the organic solvent easily.

4. No ligands which poison the metallising bath should be liberated when the organometallic compound is reduced.

5. The reduced active nuclei should adhere firmly to the surface in aqueous solution, in order to prevent decomposition of the baths by entrained metals.

6. The activating solutions used should not attack the polymer film either chemically or physically.

For carrying out the process according to the invention, an organometallic compound of elements of sub-groups 1 and 8 of the periodic table, in particular of Cu, Ag, Au, Pd and Pt with an additional functional group, is dissolved in an organic solvent. Mixtures of compounds can of course also be used. The concentration of organometallic compounds should be between 0.01 g and 10 g per liter, but in particular cases can also be below or above these limits.

Particularly suitable organic solvents are polar, protic and aprotic solvents, such as methylene chloride, chloroform, 1,1,1-trichloroethane, trichloroethylene, perchloroethylene, acetone, methyl ethyl ketone, butanol, ethylene glycol and tetrahydrofuran.

Mixtures of the above solvents and blends with other solvents, such as benzine, ligroin, toluene and the like, can of course also be used. In the process according to the invention, the surfaces of the substrates to be metallised are wetted with these solutions, the action preferably lasting 1 second to 10 minutes. Methods such as immersion of the laminated material into the solution or the spraying of the polymer surface with the activating solutions are particularly suitable for this. It is also possible to apply the activating solutions by stamping or by pressure methods.

The organic part of the activator can also be oligomers, prepolymers or end polymers which have molecular weights of 150 to 1,000,000 and which optionally possess additional groups which promote fixing of the activator to the polymer surface.

Homopolymers or copolymers of conjugated dienes (for example styrene/butadiene copolymers) and unsaturated polyesters which form π-complexes with the metals, for example palladium, are preferred.

Carriers can also be coated, by known processes, with the polymers described.

The core mateial can thus be provided with a polymer film by extrusion or by coating.

Coating of the core layer is particularly preferably carried out with a corresponding polymer or prepolymer solution, the solvent being removed when the polymer film is hardened.

A further variant is spraying of the core layer with pulverulent prepolymers which form partially cross-linked films on hardening and/or heating. Such pulverulent prepolymers or high polymers can be applied to the surface of the core layer by known processes, such as, for example, the "electrostatic powder-spraying process" (EPS).

Suitable core materials for the process according to the invention are organic or inorganic substrates which have dimensional stability under heat for a period of at least 20 minutes at 140° C. Substrates which may be mentioned in this connection are metals, such as, for example, steels, copper, aluminium and gold, metal alloys, such as, for example, bronze and brass, and furthermore glass, quartz, ceramics and heat-stable synthetic and/or naturally occurring resins, such as, for example, phenol/formaldehyde resins, melamine resins, polyamides, polyesters, polycarbonates, polyacrylonitrile, polyvinyl chloride and mixtures thereof or copolymers of the monomers on which these are based.

The customery fillers, such as glass fibres, carbon fibres, aramid fibres, carbon black or talc, can of course also be added to the abovementioned polymers.

In particular cases, the core and polymer film can be prepared from the abovementioned polymers which are preferably to be used. Thus, for example, glass fibre, aramid fibre or carbon fibre mats and/or mixtures thereof with one another can be impregnated with prepolymers or end polymers suitable for carrying out the process according to the invention and, after physical or chemical drying of the polymer matrix, can, if appropriate, be coated with a polymer film consisting of the same polymer and can then be adhesively metallised according to the invention.

In general, the coating thickness of the prehardened and/or semi-hardened polymer film can be between 2 $\mu$m and 200 $\mu$m, and coating thicknesses of 5 to 100 $\mu$m will be preferred and those of 15 $\mu$m to 50 $\mu$m will be particularly preferred.

As is known, the prehardening and final hardening conditions for the polymer films depend on their chemical structure. The polymers are in general to be treated for 2-60 minutes, preferably 5 to 30 minutes, at a temperature of 90°-400° C., preferably 100°-350° C. and particularly preferably 150° to 300° C. Catalysts can of course be added to the systems suitable for carrying out the process according to the invention, it being possible to vary the hardening or final hardening conditions in respect of time and temperature downwards or, if appropriate, upwards by choosing suitable catalysts.

In general, the degree of hardness of the polymer film which has not been completely hardened and is to be metallised should be 30 to 80% of the degree of hardness which can be achieved after the final hardening.

The final hardening is preferably carried out in the softening range of the polymer film or electrical insulating lacquer.

The procedure is generally as follows in carrying out the process according to the invention in practice. The substrates to be metallised are provided with a polymer film which, if appropriate, is prehardened at elevated temperatures, after freeing from solvents, and is then activated with a colloidal or ionic, aqueous solution of elements of sub-groups 1 and 8 of the periodic table, freed from excess activating nuclei and, if appropriate, sensitised by treatment with a hydrochloric acid solution of Sn-II-Cl$_2$. Another elegant activation of the lacquer surfaces which is simple to carry out industrially can be effected with the aid of certain organometallic compounds of elements of sub-groups 1 and 8.

This very particularly preferred type of activation in the process according to the invention comprises sensitising the activating nuclei in the metallising bath directly with the reducing agent of the metallisation without a current.

This process variant is especially suitable for nickel or cobalt baths containing aminoborane or copper baths containing formalin.

The surfaces thus activated can be used directly for metallisation without a current.

Preferred metallising baths which can be used in the process according to the invention are baths with nickel salts, cobalt salts, copper salts, gold and silver salts or mixtures thereof with one another or with iron salts, manganese salts and tungsten salts. Such metallising baths are known in the technique of metallisation without a current.

The coating thickness of the chemically deposited metal coating before heat treatment should be in the range from 0.01 to 5.0 $\mu$m, but in particular cases this can be varied upwards.

If appropriate, after deposition of the metal, the test pieces are washed with water and freed from salts and reducing agents, and they are then heated, preferably under prehardening conditions for 2 to 60 minutes, particularly preferably 5 to 30 minutes, and subjected to final hardening. In particular cases, final hardening or after-heating can be carried out in an inert gas atmosphere. If desired, such metal coatings can be reinforced in any manner by a chemical or electrolytic route.

The process products according to the invention can be used in diverse manners, for example in the production of printed electrical circuits (printed board assemblies) by the semi-additive process, the completely additive process, the metal resist process, the substractive-additive process or the multilayer technique (compare R. Weiner, "Kunststoff-galvanisierung" ("Electroplating of Plastics"), Eugen G. Lenze-Verlag, Saulgau/Württemberg (1973)).

The new invention is illustrated in more detail by the examples which follow, without its scope thereby being restricted.

EXAMPLE 1

A 50×200×2 mm metal sheet is coated with a polyhydantoin lacquer solution by immersion, and the coating is prehardened at 240° C. for 15 minutes. The approximately 20 $\mu$m thick lacquer film thus obtained is immersed in an activating solution of 1.50 g of 8-octadien-1-ol-palladium dichloride in 1 liter of methanol and is then nickelled, without a current, in a 1 liter nickelling bath which contains 3.5 g of dimethylaminoborane, 30 g of nickel chloride and 10 g of citric acid and has been adjusted to pH 8.2 with concentrated ammonia.

After about one minute, the surface of the test piece darkens, and after 10 minutes the test piece is provided with a shining, electrically conductive Ni layer 0.2 $\mu$m thick.

The test piece is now taken out of the metallising bath, washed with distilled water and subjected to a final heat-treatment at 250° C. in a drying cabinet for 10 minutes. A four-layer laminated material is obtained, the metal coating of which is so firmly anchored to the lacquer surface that no peeling takes place when the peel strength test according to DIN 53494 is carried out.

The abovementioned prepolymer solution was prepared as follows:

58.8 g of diallyl maleate and 100.8 g of dimethyl maleate are initially introduced into 300 ml of glycol monomethyl ether acetate. 58 g of hexamethylenediamine in 50 ml of methanol are added dropwise at 0°-5° C., while stirring. The mixture is then stirred at room temperature for 24 hours. After addition of 300 g of glycol monomethyl ether acetate, 131.4 g of 4,4'-diisocyanatodiphenylmethane are added in portions at temperatures below 50° C. The mixture is stirred at 100° C. for 2 hours, 100 g of benzyl alcohol are added dropwise and the mixture is then stirred under reflux for 10 hours, the methanol formed being distilled off.

After cooling, a clear viscous solution with a solids content of 29% is obtained.

EXAMPLE 2

A laminated material which has a brass core 300×100×1 mm in size and has been provided with a polymer film according to Example 1 is activated in a commercially available, colloidal and hydrochloric acid palladium brine bath, sensitised in a hydrochloric acid solution of $Sn^{2+}$ and then metallised in a customary chemical Ni hypophosphite bath at 85° C. for 20 minutes, washed with distilled water and then subjected to final hardening according to Example 1.

A four-layer laminated material of a metal core with two electrically non-conductive insulating layers, on the surface of which the metal coating deposited by a chemical route is firmly anchored, is obtained. In spite of thickening to 40 Hm by electroplating, its tear strength is less than its adhesive strength.

EXAMPLE 3

A glass fibre-reinforced epoxide resin sheet 200×20×3 mm in size is coated with a 25% strength polymer solution according to Example 1 in glycol monomethyl ether acetate/benzyl alcohol (50:50% by volume) by immersion. After physical drying of the polymer layer, the sheet is heat-treated at 200° C. for 20 minutes and then activated in an activating solution of 0.7 g of butadienepalladium chloride in 1 liter of 1,1,1-trichloroethane at 25° C. for 3 minutes, dried at 35° C., metallised in a chemical coppering bath from Messrs. Shipley GmbH, Stuttgart, at 30° C. for 20 minutes and subsequently subjected to final heat-treatment at 200° C. for 30 minutes. The metal coating thus applied to the surface of the test piece has such a high peel strength that it cannot be measured according to DIN 53494.

EXAMPLE 4

A carbon fibre-reinforced polyimido-amide sheet which is stable to high temperatures is coated, at 40° C., with a 30% strength by weight prepolymer solution based on the oligomeric polyimide in cresol, which is prepared according to U.S. Pat. No. 3,179,614, the solvent is removed from the polymer layer at 80° C., the test piece is prehardened at 230° C. for 20 minutes, activated according to Example 3 and nickelled according to Example 1 in a chemical metallising bath and the polymer layer is then subjected to final hardening at 240° C. for 15 minutes. The peel strength of the metal coating after electrolytic thickening is ~80 N/25 mm.

EXAMPLE 5

An aluminium sheet 200×40×1 mm in size is provided with 0.5 mm perforations and coated with a commercially available prepolymeric hydantoin solution (25% strength in cresol) with the trade name Resistern PHIO from Messrs. Bayer AG, Leverkusen, the solvent is removed from the polymer film at 50° C. and the test piece is then subjected to heat treatment at 260° C. for 18 minutes. The approximately 30 μm thick polymer layer thus obtained is activated according to Example 1, dried, covered with a mask which is based on a styrene/butadiene copolymer and has free comb-like tracks about 1 mm wide, and is then nickelled, without a current, according to Example 1.

After about one minute, the free tracks darken, and after about 10 minutes a 0.2 μm thick layer of Ni with a metallic shine is deposited, and is thickened to 40 um with electroplated copper.

A through hole plated electrical track board 35 with conductor tracks 1 mm wide and 40 μm thick is obtained. The metal layer adheres to the substrate surface so well that, in spite of after-heating at 240° C. for 30 minutes, it cannot be removed from the surface of the substrate.

EXAMPLE 6

A graphite fibre-reinforced phenolic resin sheet 20×200×2 mm in size is coated with a commercially available two-component DDN lacquer with the trade name Emalit from Messrs. Bullig and Kemper, Cologne, the lacquer layer is prehardened at 80° C. for 15 minutes, activated according to Example 3, nickelled according to Example 1 and washed with distilled water and the test piece is then heat-treated at 130° C. for 15 minutes under an $N_2$ atmosphere. A laminated material on which the Ni coating has a peel strength according to DIN 53494 of about 75 N/25 mm is obtained.

EXAMPLE 7

A copper foil 20×°×1 mm in size provided with a polymer film according to Example 5 is activated in an activating bath consisting of 0.5 g of 4-cyclohexene-1,2-dicarboxylic anhydride-palladium chloride and 500 ml of methanol in the course of 20 seconds and is then coppered at 20° C. without a current in an aqueous coppering bath which contains, per liter, 10 g of $CuSO_4$, 15 g of Seignette salt and 20 ml of 35% strength by weight formalin solution and has been adjusted to pH 12 to 13 with 32% strength by weight NaOH solution, and the test piece is then heat-treated according to Example 5.

A multi-layer laminated foil of plastic and copper is obtained. The chemical Cu layer adheres to the polymer layer so firmly that it is not possible to carry out a peel strength measurement according to DIN 53494.

EXAMPLE 8

An Al sheet provided with perforations and coated with a polymer layer according to Example 5 is activated according to Example 7, nickelled according to Example 1 and subjected to final heat treatment according to Example 5. The firmly adhering metal coating thus obtained is sprayed with a UV-curable lacquer based on oligomeric 1,4-polyisoprene (~5% strength by weight in xylene) containing a light-sensitive diazole initiator, and the lacquer layer is covered with a mask and partially hardened with the aid of UV radiation. The non-hardened polymer content is removed in methanol (extra pure) after the mask has been taken off the test piece. The Ni coating not covered by the UV lacquer is etched off from the test piece by treatment in a sulphuric acid etching solution containing $Fe^{3+}$ and the test piece is then washed with distilled water. A laminated material provided with firmly adhering, electrically conductive tracks 0.2 μm thick is obtained.

EXAMPLE 9

A brass sheet 100×100×1 mm in size is coated, by immersion, with an oligomeric 15% strength polyphenylene sulphone-ether in pure $CH_2Cl_2$, which is prepared from the Na salt of bisphenol A and 4,4-dichlorophenyl sulphone in accordance with the method of R. N. Johnson, A. G. Farnham et al. "Preparative Methods of Polymer Chemistry", Interscience Publ. New York, page 183 (1968), the film coating is preheated at 200° C. under an N₂ atmosphere and with strict exclusion of moisture for 15 minutes and activated and nickelled according to Example 1 and the test piece is then after-heated at 230° C. for 10 minutes.

A firmly adhering, electrically conductive nickel coating of peel strength, according to DIN 53494, ~90 N/25 mm is obtained.

EXAMPLE 10

An aluminium foil 200×100×1 mm in size is coated, by immersion, with a 30% strength by weight solution, precondensed at 250° C. under an N₂ atmosphere, of 1 mole of pyromellitic acid dianhydride and 1 mole of 4,4'-diaminodiphenyl ether in dry dimethylacetamide, and the coating is prehardened at 250° C. for 10 minutes. The approximately 20 μm thick polymer film thus obtained is activated according to Example 3, metallised according to Example 1, washed with distilled water and then subjected to final hardening at 270° C. for 8 minutes. A multi-layer laminated material on which the nickel coating deposited by a chemical route has an adhesive strength, determined by the peel strength according to DIN 53494, of ~75 N/25 mm is obtained.

EXAMPLE 11

A glass fibre-reinforced plastic sheet of polyamide 6,6 150×100×10 mm in size is coated, by immersion, with a commercially available prepolymer solution based on polyamidoimide and is prehardened at 250° C. for 10 minutes. The approximately 30 μm thick polymer film thus obtained is activated according to Example 3, metallised according to Example 1 and then heat-treated at 265° C. for 7 minutes.

A shiny, firmly adhering Ni coating of peel strength, according to DIN 53 494, ~80 N/25 mm is obtained.

We claim:
1. A process for the production of a solderable metallized laminated material comprising
   (a) coating a solder-resistant core material with a solder-resistant, non-conductive polymer film,
   (b) activating without oxidative pretreatment and without mechanical abrading, on the polymer film which has not been completely hardened,
   (c) conducting a wet-chemical metallization of the polymer film and
   (d) hardening the polymer film, wherein the activation is carried out with a solution or dispersion of an organometallic compound in an organic solvent,
said polymer film having dimensional stability under heat for a period of at least 20 minutes ≦140° C. and having a specific electrical surface resistance of at least 10¹⁰ Ωcm⁻¹ and said polymer film being based on an aromatic polyether-sulphone, an aromatic polyether, a polyamide, a polyimide, a polyamidoimide, a polyester-imide, a polyester-amide, an isocyanurate-containing polyester, a polybenzoxazinedione, an aromatic polyphenylenesulphide, a polyparabanic acid, a polyurethane or a polyhydantoin,
the metallization being carried out to a thickness of the coating in the range of 0.01 to 5 μm,
and the hardening being achieved by subjection to a final heat-treatment.

2. A process according to claim 1, wherein the metallic element of the organometallic activator is palladium.

3. A process according to claim 1, wherein the organometallic activator is a complex of palladium with a homopolymer or copolymer of a conjugated diene or an unsaturated polymer.

4. A process according to claim 1, wherein the polymer film is based on polyhydantoin.

5. A process according to claim 1, wherein the polyhydantoin contains double bonds in at least one of the end positions, a side chain and the main chain.

6. A process according to claim 1, wherein the polyhydantoin includes recurring groups of the formula

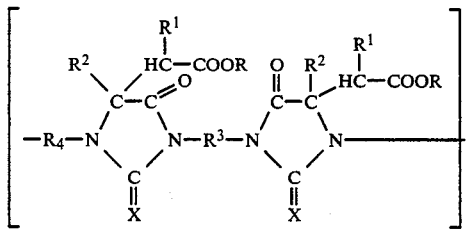

wherein
R, R¹ and R² denote hydrogen or unsubstituted or substituted alkyl or alkenyl,
R³ denotes unsubstituted or substituted alkyl, aryl or aralkyl or heterocyclic radicals,
R⁴ denotes unsubstituted or substituted alkyl, aryl or arlkyl or heterocyclic radicals and
X denotes oxygen or sulphur.

* * * * *

UNITED STATES PATENT AND TRADEMARK OFFICE
CERTIFICATE OF CORRECTION

PATENT NO. : 4,659,592

DATED : April 21, 1987

INVENTOR(S) : Kirkor Sirinyan, et al.

It is certified that error appears in the above-identified patent and that said Letters Patent is hereby corrected as shown below:

| | |
|---|---|
| Col. 2, line 52 | After "1,2" insert -- - -- |
| Col. 3, line 42 | Correct spelling of --Functional-- |
| Col. 8, line 6 | Delete "35" |
| Col. 8, line 27 | Delete "°" and substitute --20-- |
| Col. 10, line 5 | Delete "≅" and substitute -- ≦ -- |
| Col. 10, line 50 | Delete "arlkyl" and substitute --aralkyl-- |

Signed and Sealed this

Thirteenth Day of October, 1987

Attest:

DONALD J. QUIGG

Attesting Officer

Commissioner of Patents and Trademarks